United States Patent
Lee (10) Patent No.: US 6,694,477 B1
(45) Date of Patent: Feb. 17, 2004

(54) COMMUNICATION CHANNEL EMPLOYING AN ECC DECODER ENHANCED BY LIKELY ERROR EVENTS OF A TRELLIS SEQUENCE DETECTOR

(75) Inventor: Patrick J. Lee, San Jose, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 431 days.

(21) Appl. No.: 09/675,852

(22) Filed: Sep. 28, 2000

(51) Int. Cl.[7] .................. H03M 13/00; H03M 13/03; H04L 23/02; H04L 5/12
(52) U.S. Cl. .................. 714/784; 714/755; 714/795
(58) Field of Search .................. 714/755, 794, 714/795, 791, 796, 784; 375/262, 263

(56) References Cited

U.S. PATENT DOCUMENTS

| | | | | |
|---|---|---|---|---|
| 5,422,894 A | * | 6/1995 | Abe et al. .................. | 714/755 |
| 5,881,071 A | * | 3/1999 | Kuznetsov et al. ......... | 714/752 |
| 5,886,989 A | * | 3/1999 | Evans et al. ............... | 370/347 |
| 5,926,490 A | | 7/1999 | Reed et al. | |
| 5,983,383 A | * | 11/1999 | Wolf .......................... | 714/755 |
| 5,996,103 A | * | 11/1999 | Jahanghir ................... | 714/755 |
| 6,018,304 A | | 1/2000 | Bessios | |
| 6,212,659 B1 | * | 4/2001 | Zehavi ....................... | 714/755 |
| 6,405,342 B1 | * | 6/2002 | Lee ............................ | 714/792 |
| 6,434,719 B1 | * | 8/2002 | Livingston .................. | 714/804 |
| 6,493,402 B1 | * | 12/2002 | Fimoff ........................ | 375/321 |
| 6,516,443 B1 | * | 2/2003 | Zook .......................... | 714/792 |

OTHER PUBLICATIONS

Sawaguchi, H. and Wolf, J.K.; Turbo decoding for high–rate concatenated parity–check codes on PRML channels; This paper appears in IEEE Transactions on Magnetics Sep. 2000 On page(s): 2173–2175, vol.: 36; Presented at Intermag 2000 on Apr. 09, 2000 –04/13/20.*

Wicker, Stephen B. and Bhargava, Vijay K., "Reed Solomon Codes and Their Applications", 1994, pp. 242–271, Chapter 11, Institute of Electrical Engineers, Inc., New York, NY.

Forney, G. David, Jr., "Generalized Minimum Distance Decoding", Apr. 1996, pp. 125–131, IEEE Trans. Info. Theory.

Hagenauer, Joachim and Hoeher, Peter, "A Viterbi Algorithm with Soft–Decision Outputs and its Applications", Nov. 1989, pp. 1680–1686, IEEE Globecom Conference, Dallas, TX.

* cited by examiner

Primary Examiner—Albert Decady
Assistant Examiner—Joseph D. Torres
(74) Attorney, Agent, or Firm—Milad G. Shara, Esq.; Howard H. Sheerin, Esq.

(57) ABSTRACT

A communication channel is disclosed comprising a trellis sequence detector for detecting an estimated data sequence from signal sample values. A post processor detects and corrects an error event of the trellis sequence detector by remodulating the estimated data sequence into a sequence of expected sample values, computing samples errors as the difference between the expected samples and signal samples, and correlating the sample errors with error event samples. The communication channel further comprises a Reed-Solomon error correction code (ECC) decoder for decoding a Reed-Solomon codeword in the estimated data sequence in response to the detected error event.

10 Claims, 6 Drawing Sheets

COMMUNICATION CHANNEL EMPLOYING AN ECC DECODER ENHANCED BY LIKELY ERROR EVENTS OF A TRELLIS SEQUENCE DETECTOR

BACKGROUND OF THE INVENTION

1. Field of the Invention

The present invention relates to communication systems. More particularly, the present invention relates to a communication channel employing an error correction code (ECC) decoder enhanced by likely error events of a trellis sequence detector.

2. Description of the Prior Art

Various techniques are typically employed to maximize the realized capacity of a communication channel in terms of the rate that information can be transmitted through the channel and accurately reproduced at the receiver. Two techniques in wide use today are partial response (PR) equalization with maximum likelihood (ML) trellis sequence detection, and error correction codes (ECC) such as the well-known Reed-Solomon code. PR equalization allows for a controlled amount of inter-symbol interference with respect to the analog pulses representing the digital data transmitted through the channel. A trellis sequence detector at the receiver comprises a state machine matched to the PR equalization and outputs an estimated data sequence by selecting the most likely sequence through a trellis with respect to the signal samples input into the detector. An ECC code is then used to detect and correct errors in the estimated data sequence output by the trellis sequence detector. An ECC encoder encodes the digital data before transmission through the channel in order to generate redundancy symbols appended to the data to form ECC codewords. The received ECC codewords (in the estimated data sequence output by the trellis sequence detector) are then decoded by an ECC decoder at the receiver. The redundancy symbols enable the ECC decoder to detect and correct a predetermined number of errors in a received ECC codeword.

In a paper by J. Hagenauer and P. Hoeher entitled "The Viterbi Algorithm with Soft-Decision Outputs and Its Applications," *Proceedings of the IEEE Globecom Conference, Dallas, Tex.*, pp. 47.1.1–47.1.7, November 1989, a technique is disclosed wherein a trellis sequence detector outputs reliability metrics for each bit in the estimated data sequence. The reliability metrics are computed relative to the channel metrics generated at each decision point through the trellis. The ECC decoder converts the reliability metrics corresponding to each bit in the estimated data sequence into reliability metrics for each symbol in an ECC codeword. The most unreliable symbols are then "erased" so that the ECC decoder can perform "erasure" decoding. With erasure decoding, a codeword can be corrected as long as the number of errors t and the number of erasures e satisfy the inequality $2t+e \leq d_{min}-1$. For every error transformed into an erasure, the decoding capability is clearly extended.

However, there are several drawbacks associated with the aforementioned technique of erasure decoding an ECC codeword using reliability metrics generated by a trellis sequence detector. Since a reliability metric is generated for each bit in the estimated data sequence, a significant amount of memory is needed to store the reliability metrics, and the memory increases as the resolution of the reliability metrics increases. Further, the probability of miscorrecting an ECC codeword increases as the number erasure pointers increases.

Another technique for enhancing the performance of a communication channel is disclosed by Roger Wood in "Turbo-PRML: A Compromise EPRML Detector", *IEEE Transactions on Magnetics*, Vol. 29, No. 6, November 1993. With Turbo-PRML, an error event detector is employed to detect likely error events of the trellis sequence detector. The most likely error events are then corrected prior to decoding the estimated data sequence by the ECC decoder. A problem with this technique, however, is that an error event may be falsely detected and miscorrected. Additional redundancy symbols can be added to the input stream to prevent miscorrections by the error event detector; however, the additional redundancy symbols decrease the code rate of the communication channel, and thus decrease the realized capacity of the communication channel.

There is, therefore, a need to enhance the performance of a communication channel in order to increase the channel's realized capacity.

SUMMARY OF THE INVENTION

The present invention may be regarded as a communication channel comprising a sampler for sampling an analog data signal to generate a sequence of signal samples, a trellis sequence detector for detecting an estimated data sequence from the signal samples, and an error correction code (ECC) decoder. The estimated data sequence comprises a received codeword, wherein the ECC decoder detects and corrects errors in the received codeword. The trellis sequence detector comprises a metrics calculator for computing trellis state metrics relative to the signal samples and expected samples of valid output sequences, a memory for storing survivor data sequences associated with paths of the trellis, wherein the survivor data sequences comprise the estimated data sequence. The trellis sequence detector further comprises a memory controller, responsive to the state metrics, for updating the memory, and an error event detector for detecting an error event associated with the trellis sequence detector. The ECC decoder is responsive to the detected error event, and performs the following steps:

i. determining whether the received codeword comprises errors;
  ii. determining whether the received codeword is correctable;
  iii. if the received codeword is uncorrectable, modifying the received codeword relative to the error event; and
  iv. repeating steps (i) and (ii) at least once.

The present invention may also be regarded as a method of transmitting data through a communication channel. An analog data signal is sampled to generate a sequence of signal samples. An estimated data sequence is detected from the signal samples, wherein the estimated data sequence comprises a received codeword. An error event is detected in the estimated data sequence, and used to detect and correct errors in the received codeword by performing the following steps:

i determining whether the received codeword comprises errors;
  ii determining whether the received codeword is correctable;
  iii if the received codeword is uncorrectable, modifying the received codeword relative to the error event; and
  iv repeating steps (i) and (ii) at least once.

DESCRIPTION OF THE PREFERRED EMBODIMENTS

Figure 1:
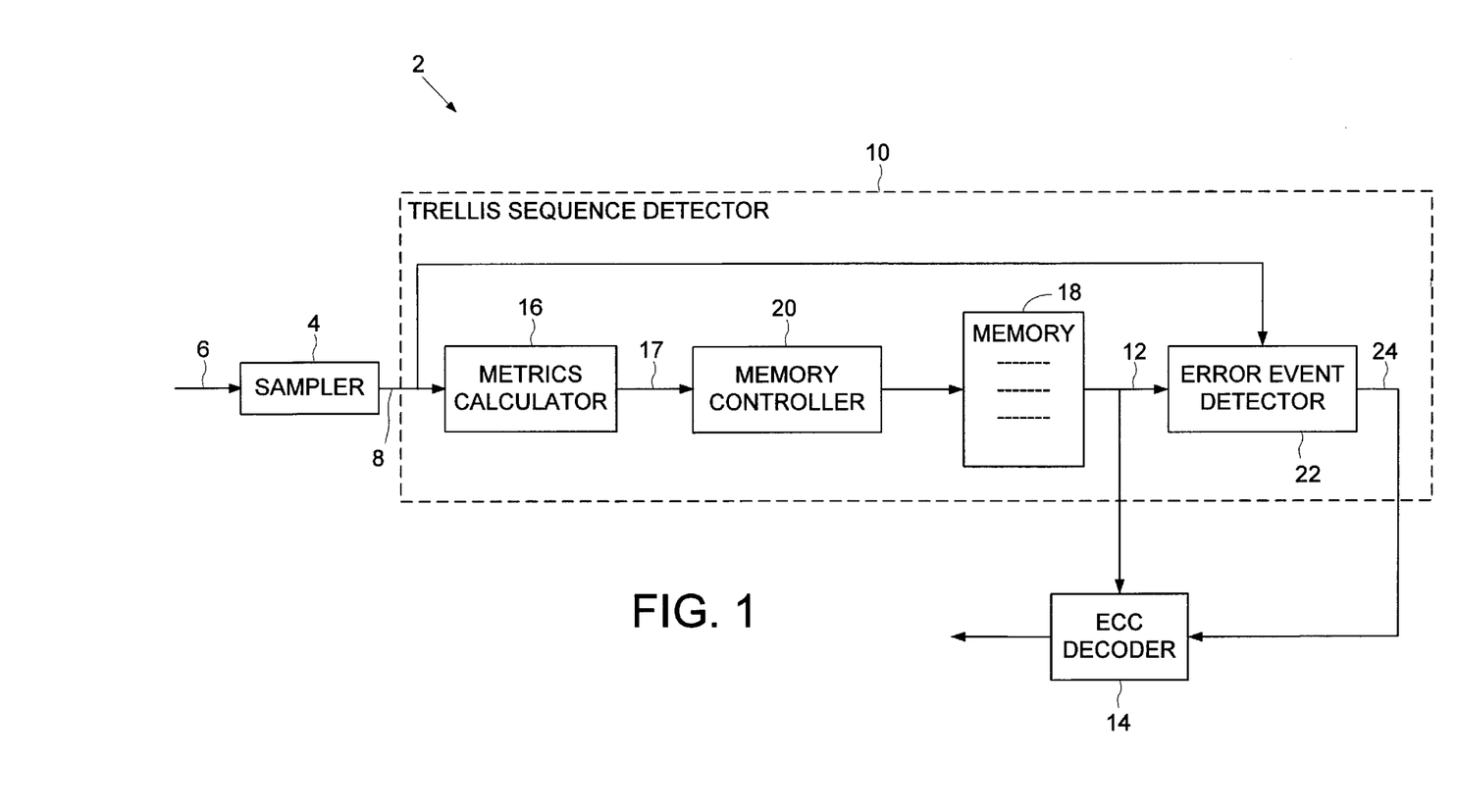
FIG. 1 shows a communication channel according to an embodiment of the present invention as comprising a trellis sequence detector comprising an error event detector for detecting likely error events of the trellis sequence detector, and an ECC decoder for decoding a received codeword using the detected error event.

FIG. 1 shows a communication channel 2 according to an embodiment of the present invention comprising a sampler 4 for sampling an analog data signal 6 to generate a sequence of signal samples 8, a trellis sequence detector 10 for detecting an estimated data sequence 12 from the signal samples 8, and an error correction code (ECC) decoder 14. The estimated data sequence 12 comprises a received codeword, wherein the ECC decoder 14 detects and corrects errors in the received codeword. The trellis sequence detector 10 comprises a metrics calculator 16 for computing trellis state metrics 17 relative to the signal samples 8 and expected samples of valid output sequences, a memory 18 for storing survivor data sequences associated with paths of the trellis, wherein the survivor data sequences comprise the estimated data sequence 12. The trellis sequence detector 10 further comprises a memory controller 20, responsive to the state metrics 17, for updating the memory 18, and an error event detector 22 for detecting an error event 24 associated with the trellis sequence detector 10. The ECC decoder 14 is responsive to the detected error event 24, and performs the following steps:

i. determining whether the received codeword comprises errors;

ii. determining whether the received codeword is correctable;

iii. if the received codeword is uncorrectable, modifying the received codeword relative to the error event; and iv. repeating steps (i) and (ii) at least once.

In one embodiment, the metrics calculator 16 generates the trellis state metrics 17 by accumulating the square of the difference between the actual signal samples 8 and expected signal samples of valid output sequences. The memory controller 20 selects the minimum path metric computed for each state of a trellis to extend the survivor sequences to the next state in the trellis. The survivor sequences stored in the memory 18 and corresponding to the states not selected merge into the survivor sequences corresponding to the states that are selected. Eventually, all of the survivor sequences merge into a single survivor sequence (as long as the input sequence is appropriately constrained) which is the estimated data sequence 12 output by the memory 18. Further details of a suitable metrics calculator 16, memory controller 20 and memory 18 are disclosed by Roy D. Cideciyan, et al. in "A PRML System for Digital Magnetic Recording", *IEEE Journal on Selected Areas in Communications*, Vol. 10, No. 1, January 1992, the disclosure of which is incorporated herein by reference. A PR-IV equalizer and trellis sequence detector is disclosed in the aforementioned paper; however, any suitable equalizer and trellis sequence detector may be employed, such as EPR-IV, EEPR-IV, Decision Feedback, Noise Predictive, etc.

Figure 2:
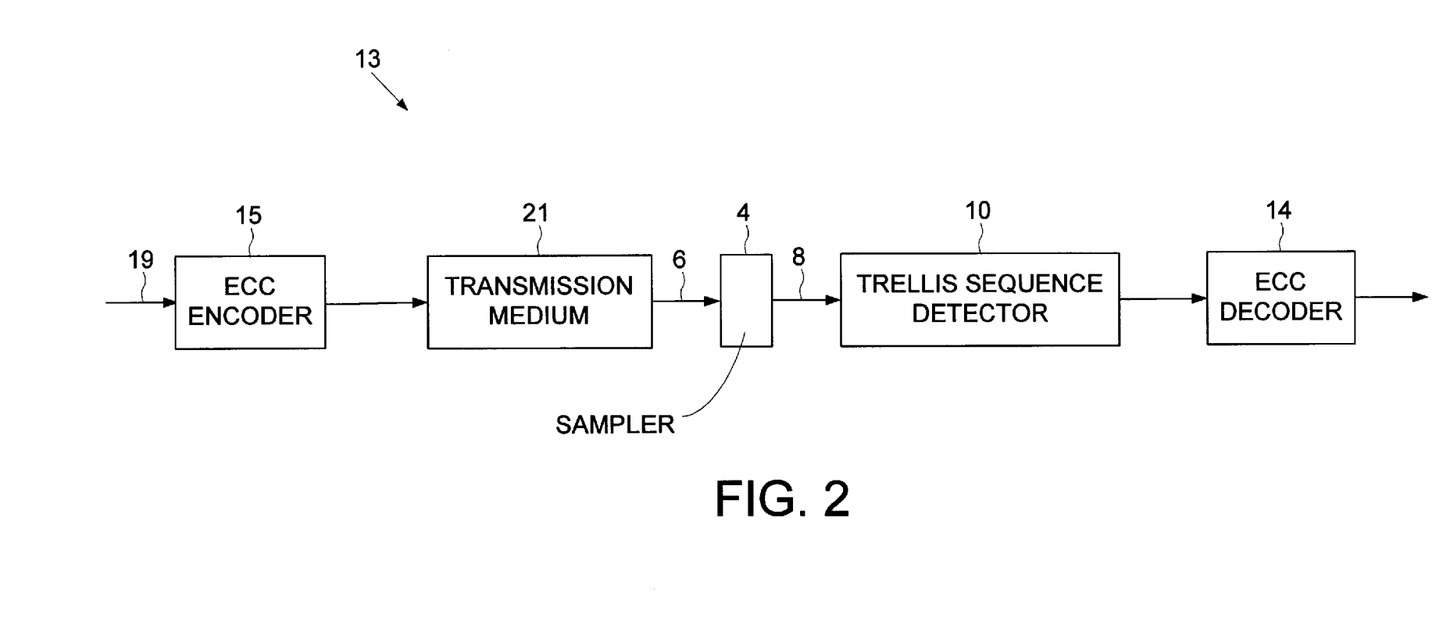
FIG. 2 shows details of a communication system according to an embodiment of the present invention comprising an ECC encoder for encoding an input stream into ECC codewords transmitted through a transmission medium, and a trellis sequence detector and ECC decoder of FIG. 1 for detecting and decoding the received ECC codewords.

FIG. 2 shows a communication system 13 according to an embodiment of the present invention comprising an ECC encoder 15 for encoding an input stream 19 into ECC codewords transmitted through a transmission medium 21, and a trellis sequence detector 10 and ECC decoder 14 of FIG. 1 for detecting and decoding the received ECC codewords. The ECC encoder 15 encodes the input stream 19 according to any suitable error correction code, such as the well-known Reed-Solomon error correction code. In one embodiment, the ECC encoder 15 comprises an N-way interleaver for encoding the input stream 19 into N interleaved codewords.

Figure 3:
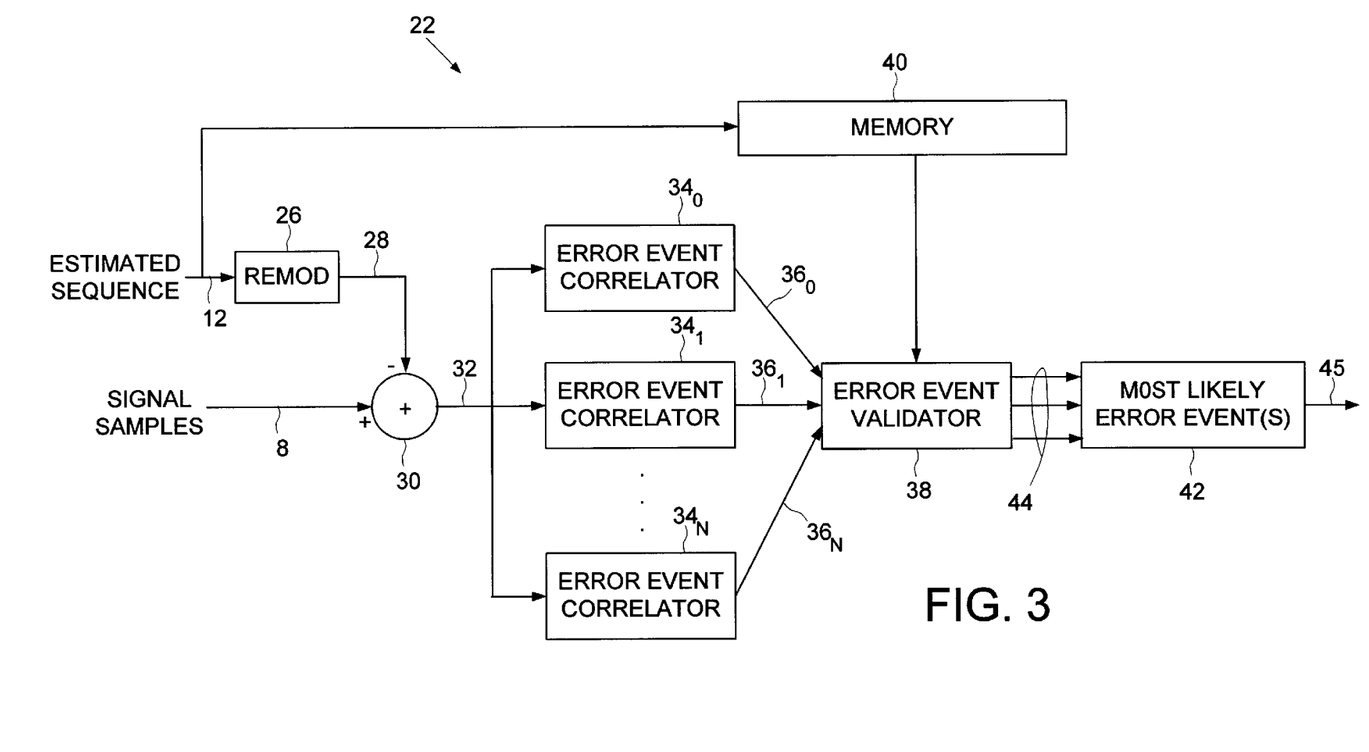
FIG. 3 shows details of the error event detector of FIG. 1, comprising a plurality of error event correlators matched to the likely error events of the trellis sequence detector, the error event correlators for correlating an error event sequence with a sample error sequence generated by subtracting a remodulated sample sequence with the signal sample sequence.

FIG. 3 shows details of a suitable error event detector 22 for use in the trellis sequence detector 10 of FIG. 1. A remodulator 26 remodulates the estimated data sequence 12 into a sequence of ideal sample values 28 which are subtracted 30 from the corresponding signal sample values 8 to generate a sequence of sample errors 32. A plurality of error event correlators $34_0$–$34_N$ correlate the sample errors 32 with error event samples corresponding to likely error events of the trellis sequence detector 10. Further details of a suitable remodulator 26 and error event correlators $34_0$–34N are disclosed by Roger Wood in "Turbo-PRML: A Compromise EPRML Detector", *IEEE Transactions on Magnetics*, Vol. 29, No. 6, November 1993, which is incorporated herein by reference.

The correlation values $36_0$–$36_N$ are processed by an error event validator 38 which evaluates the estimated data sequence 12 buffered in memory 40 to verify whether a particular error event could have occurred at the locations corresponding to the correlation values $36_0$–$36_N$. A most likely error event(s) processor 42 processes the valid correlation values 44 and saves the most likely error event(s) 45 within an error correction code (ECC) codeword. For example, the most likely error event(s) processor 42 may save the error event(s) corresponding to the maximum correlation value(s) 44 generated for an ECC codeword. In one embodiment, the most likely error event(s) processor 42 saves a plurality of error events corresponding to each error event correlator $34_0$–$34_N$, that is, a plurality of each error event are saved and processed by the ECC decoder 14.

In an alternative embodiment, the error event detector 22 of FIG. 1 is implemented within the memory controller 20 to detect the occurrence of the likely error events. This may be implemented, for example, by evaluating when a likely error event could occur relative to the paths selected through the trellis together with the metrics associated with the unselected paths.

Figure 4A:
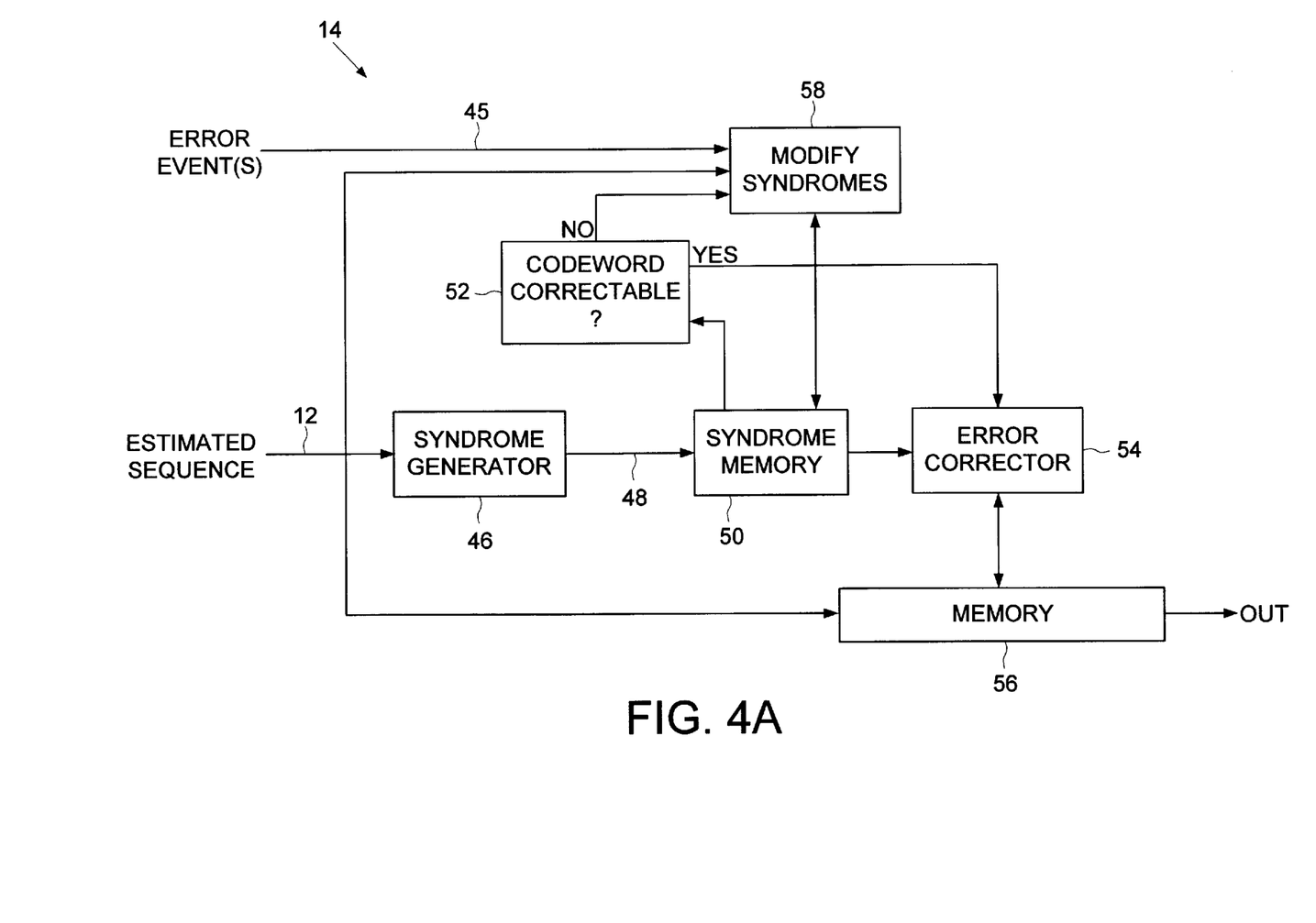
FIG. 4A shows an ECC decoder according to one aspect of the present invention, wherein syndromes are generated for a received codeword, and the syndromes are modified relative to the detected error event(s) if the original syndromes indicate that the received codeword is uncorrectable.

FIG. 4A shows details of a suitable ECC decoder 14 for use in FIG. 1. A syndrome generator 46 processes the estimated data sequence 12 representing a received ECC codeword to generate a plurality of error syndromes 48. The error syndromes 48 are buffered in a syndrome memory 50 and processed 52 to determine whether the received codeword comprises errors, and if so, whether it is correctable. If the received codeword is correctable, then an error corrector 54 corrects the errors in the received codeword which is stored in memory 56. If the received codeword is uncorrectable, then the error syndromes are modified 58 relative to the error event(s) 45 detected by the error event detector 22 of FIG. 1. In one embodiment, the estimated data sequence 12 is processed in order to modify 58 the error syndromes. The modified error syndromes are then processed 52 to determine if the codeword is correctable. For example, a suspected error event may correspond to the error sequence "1,0,1" at a particular location within the received codeword. The error syndromes are modified 58 to effectively regenerate the error syndromes after XORing the error sequence "1,0,1" at the location of the suspected error event within the received codeword. This avoids the possibility of a miscorrection as with the prior art Turbo-PRML detector because an attempt to correct the received codeword using the ECC decoder is made before correcting the likely error event(s) detected by the error event correlators $34_0$–$34_N$. Further, no additional redundancy symbols are needed to protect against the possibility of a miscorrection using the detected error events.

In one embodiment, a plurality of error events are saved by the most likely error event(s) processor 42 of FIG. 3. For example, one or more error events may be saved for each error event correlator $34_0$–$34_N$. The error syndromes 48 are then modified in an iterative manner starting with the most likely error event, determining whether the codeword is correctable and, if not, modifying the error syndromes with the next most likely error event, determining whether the codeword is correctable, and so on. In another embodiment, the iterations may involve correcting multiple error events at a time in an attempt to correct the codeword. In yet another embodiment, all of the possible error event combinations may be exhausted in an attempt to recover the codeword.

Figure 4B:
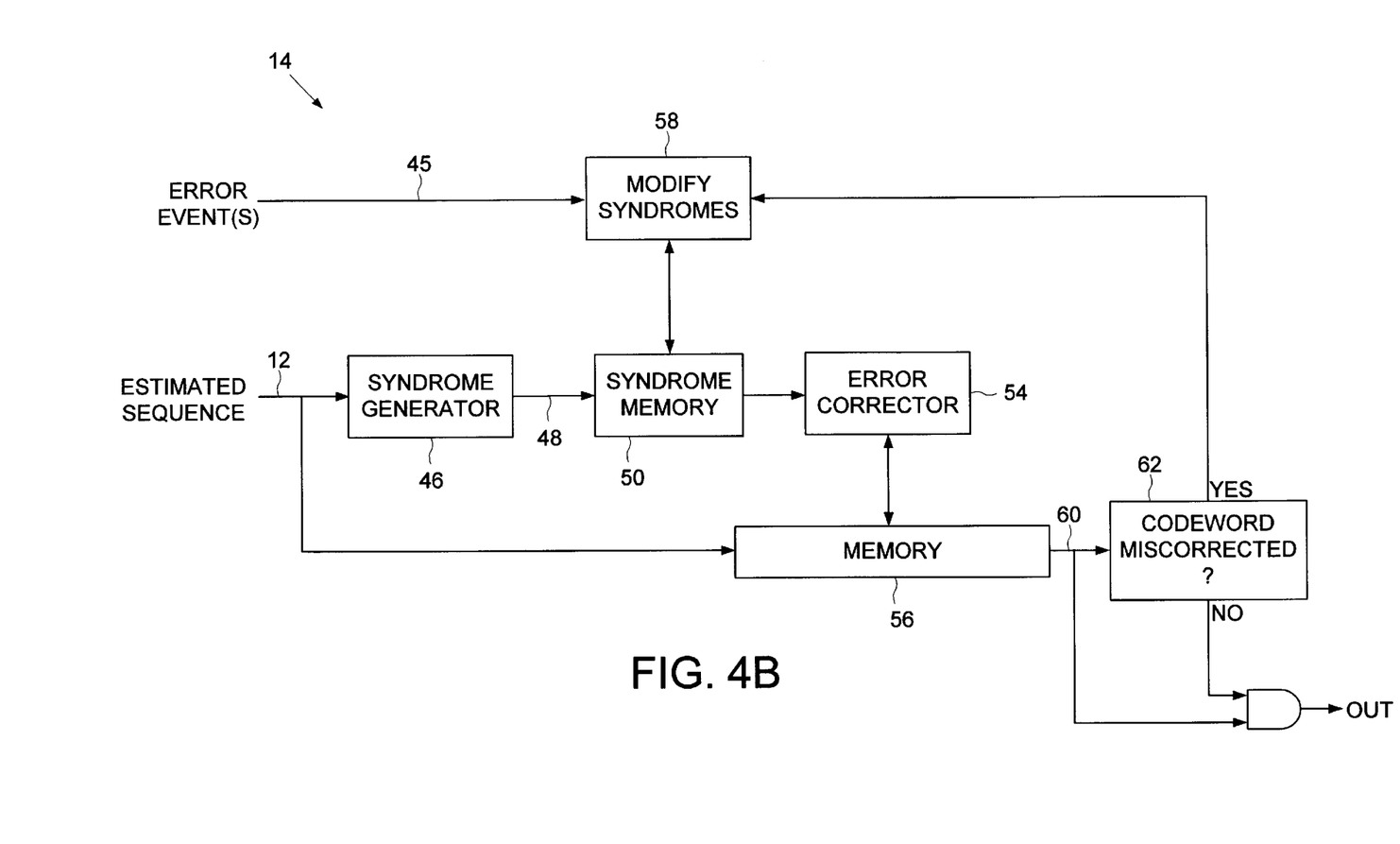
FIG. 4B shows an ECC decoder according to an alternative embodiment of the present invention, wherein the syndromes are modified relative to the detected error event(s) if the received codeword is miscorrected (as determined, for example, using a CRC check code).

FIG. 4B shows an ECC decoder 14 according to an alternative embodiment of the present invention. In this embodiment, the error corrector 54 corrects a received codeword using the unmodified error syndromes 48, and the corrected codeword 60 is processed 62 to determine if a miscorrection occurred. If a miscorrection occurred, then the error syndromes 48 are modified 58 relative to the error event(s) 45 detected by the error event detector 22. In one embodiment, a CRC check code is generated over each codeword which is used to detect miscorrections by the ECC decoder 14.

In yet another embodiment of the ECC decoder 14, rather than modify the error syndromes 48, the received codeword is modified relative to the detected error event(s) 45 and the error syndromes 48 are regenerated by the syndrome generator 46 over the modified codeword.

Figure 5:
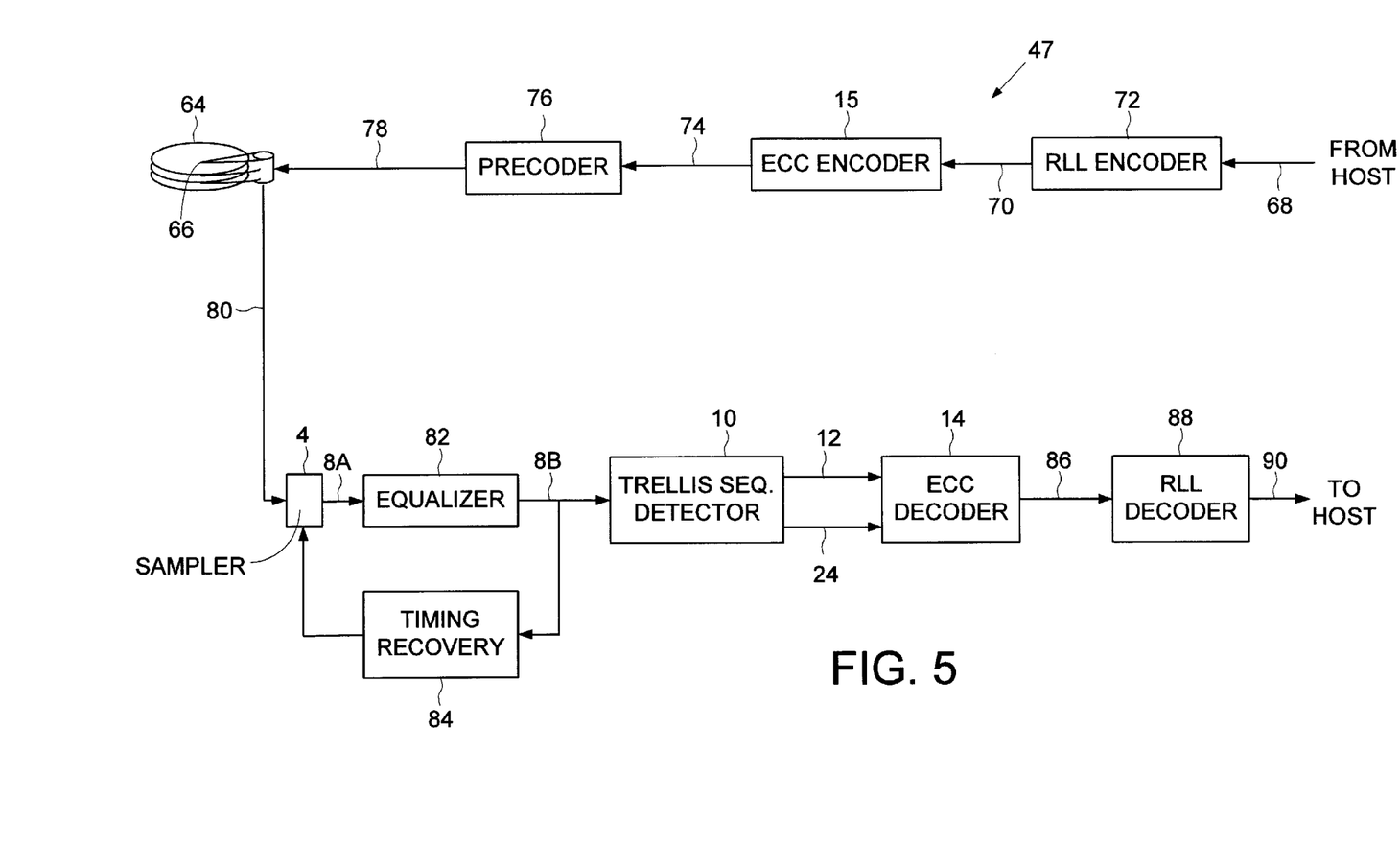
FIG. 5 shows an embodiment of the present invention, wherein the communication channel comprises a recording channel of a disk storage system.

FIG. 5 shows a disk drive 47 according to an embodiment of the present invention wherein the transmission medium of the communication system is represented as a disk 64 for storing data and a head 66 for writing data to and reading data from the disk 64. Digital data 68 received from a host computer is RLL encoded 72 according to a run-length limit (RLL) constraint. The RLL encoded data 70 is then encoded by an ECC encoder 15, such as a Reed-Solomon encoder. In one embodiment, the disk 64 comprises a plurality of concentric track where each track comprises a plurality of sectors, and the ECC encoder 15 encodes each sector into three interleaved codewords. The ECC encoder 15 also encodes the redundancy symbols attached to each codeword according to a suitable RLL constraint. The ECC encoded data 74 is precoded by precoder 76 to compensate for the transfer function of the recording channel. The precoded data 78 modulates a write current in the head 66 in order to write a series of magnetic transitions on the surface of the disk 64 representing the recorded digital data. During readback, the head 66 senses the magnetic transitions to generate an analog read signal 80. A sampler 4 samples the analog read signal 80 to generate signal samples 8A which are equalized into a desired partial response by an equalizer 82. The equalized signal samples 8B are processed by a timing recovery circuit 84 which adjusts the sampling rate of the sampler 4 in order to synchronize the signal samples 8B to the baud rate. The signal samples 8B are processed by the trellis sequence detector 10 to generate the estimated data sequence 12 and detected error event(s) 24. An ECC decoder 14 decodes the three interleaved codewords of a sector using the detected error events 24 as described above. When decoding a codeword, the ECC decoder 14 decodes the redundancy symbols attached to the codeword to reverse the RLL encoding by the ECC encoder 15. The decoded ECC codewords 86 are then decoded by an RLL decoder 88 to generate the read data 90 transmitted to the host computer.

I claim:
1. A communication channel comprising:
   (a) a sampler for sampling an analog data signal to generate a sequence of signal samples;
   (b) a trellis sequence detector for detecting an estimated data sequence from the signal samples and expected samples of valid output sequences defined by a plurality of paths of a trellis, the estimated data sequence comprising a received Reed-Solomon codeword, the trellis sequence detector comprising:
      a metrics calculator for computing trellis state metrics relative to the signal samples and the expected samples of valid output sequences;
      a memory for storing a survivor data sequence for each of the plurality of paths of the trellis, wherein the survivor data sequences comprise the estimated data sequence;
      a memory controller, responsive to the trellis state metrics, for updating the memory; and
      an error event detector for detecting an error event of the trellis sequence detector, the error event detector comprising:
         a remodulator for remodulating the estimated data sequence into a sequence of expected samples;
         a sample error generator for computing a difference between the signal samples and the expected samples to generate sample errors; and
         an error event correlator for correlating the sample errors with error event samples corresponding to the error event; and
   (c) a Reed-Solomon error correction code (ECC) decoder, responsive to the detected error event, for detecting and correcting errors in the received Reed-Solomon codeword, wherein the ECC decoder performs the steps of:
      i. determining whether the received Reed-Solomon codeword comprises errors;
      ii. determining whether the received Reed-Solomon codeword is correctable;
      iii. if the received Reed-Solomon codeword is uncorrectable, modifying the received Reed-Solomon codeword relative to the error event; and
      iv. repeating steps (i) and (ii) at least once.
2. The communication channel as recited in claim 1, wherein:
   (a) the detected error event comprises a first error event and a second error event; and
   (b) the ECC decoder performs the steps of:
      i. determining whether the received Reed-Solomon codeword comprises errors;
      ii. determining whether the received Reed-Solomon codeword is correctable;
      iii. if the received Reed-Solomon codeword is uncorrectable, modifying the received Reed-Solomon codeword relative to the first error event;

iv. determining whether the received Reed-Solomon codeword comprises errors;
v. determining whether the received Reed-Solomon codeword is correctable; and
vi. if the received Reed-Solomon codeword is uncorrectable, modifying the received Reed-Solomon codeword relative to the second error event.

3. The communication channel as recited in claim 2, wherein the ECC decoder performs the additional steps of:
i. determining whether the received Reed-Solomon codeword comprises errors;
ii. determining whether the received Reed-Solomon codeword is correctable;
iii. if the received Reed-Solomon codeword is uncorrectable, modifying the received Reed-Solomon codeword relative to the first and second error events; and
iv. repeating steps (i) and (ii).

4. The communication channel as recited in claim 1, further comprising a partial response equalizer for equalizing the signal samples according to a target partial response.

5. The communication channel as recited in claim 1, further comprising a disk and a head for writing data to and reading data from the disk.

6. A method of transmitting data through a communication channel, the method comprising the steps of:
(a) sampling an analog data signal to generate a sequence of signal samples;
(b) detecting an estimated data sequence from the signal samples and expected samples of valid output sequences defined by a plurality of paths of a trellis, the estimated data sequence comprising a received Reed-Solomon codeword, comprising the steps of:
computing trellis state metrics relative to the signal samples and the expected samples of valid output sequences;
storing a survivor data sequence for each of the plurality of paths of the trellis, wherein the survivor data sequences comprise the estimated data sequence;
updating the memory using the trellis state metrics; and
detecting an error event of the trellis in the estimated data sequence, comprising the steps of:
remodulating the estimated data sequence into a sequence of expected samples;
computing a difference between the signal samples and the expected samples to generate sample errors; and
correlating the sample errors with error event samples corresponding to the error event; and
(c) processing the detected error event to detect and correct errors in the received Reed-Solomon codeword, comprising the steps of:

i determining whether the received Reed-Solomon codeword comprises errors;
ii determining whether the received Reed-Solomon codeword is correctable;
iii if the received Reed-Solomon codeword is uncorrectable, modifying the received Reed-Solomon codeword relative to the error event; and
iv repeating steps (i) and (ii) at least once.

7. The method of transmitting data through a communication channel as recited in claim 6, wherein:
(a) the detected error event comprises a first error event and a second error event; and
(b) the step of detecting and correcting errors in the received Reed-Solomon codeword comprises the steps of:
i determining whether the received Reed-Solomon codeword comprises errors;
ii determining whether the received Reed-Solomon codeword is correctable;
iii if the received Reed-Solomon codeword is uncorrectable, modifying the received Reed-Solomon codeword relative to the first error event;
iv determining whether the received Reed-Solomon codeword comprises errors;
v determining whether the received Reed-Solomon codeword is correctable; and
vi if the received Reed-Solomon codeword is uncorrectable, modifying the received Reed-Solomon codeword relative to the second error event.

8. The method of transmitting data through a communication channel as recited in claim 7, wherein the step of detecting and correcting errors in the received Reed-Solomnon codeword comprises the additional steps of:
vii determining whether the received Reed-Solomon codeword comprises errors;
viii determining whether the received Reed-Solomon codeword is correctable;
ix if the received Reed-Solomon codeword is uncorrectable, modifying the received Reed-Solomon codeword relative to the first and second error events; and
x repeating steps (i) and (ii).

9. The method of transmitting data through a communication channel as recited in claim 6, further comprising the step of equalizing the signal samples according to a target partial response.

10. The method of transmitting data through a communication channel as recited in claim 6, further comprising the steps of writing data to and reading data from a disk.

* * * * *